US010126576B2

(12) United States Patent
Park et al.

(10) Patent No.: US 10,126,576 B2
(45) Date of Patent: Nov. 13, 2018

(54) FLEXIBLE DISPLAY APPARATUS HAVING INCREASED ELECTRICAL CONNECTION RELIABILITY OF DISPLAY DRIVER AND METHOD OF MANUFACTURING THE SAME

(71) Applicant: SAMSUNG DISPLAY CO., LTD., Yongin-si, Gyeonggi-do (KR)

(72) Inventors: Na-Ri Park, Incheon (KR); Sung-Un Park, Suwon-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 44 days.

(21) Appl. No.: 15/152,665

(22) Filed: May 12, 2016

(65) Prior Publication Data

US 2017/0131582 A1   May 11, 2017

(30) Foreign Application Priority Data

Nov. 9, 2015  (KR) .................. 10-2015-0156621

(51) Int. Cl.
*G02F 1/1333* (2006.01)
*G02F 1/133* (2006.01)
(Continued)

(52) U.S. Cl.
CPC .... *G02F 1/13306* (2013.01); *G02F 1/133305* (2013.01); *H01L 27/124* (2013.01); *H01L 51/0097* (2013.01); *H01L 51/56* (2013.01)

(58) Field of Classification Search
CPC .......... G02F 1/133305; G02F 2201/56; G02F 2001/13396; G02F 1/1339;
(Continued)

(56) References Cited

U.S. PATENT DOCUMENTS 6,501,528 B1 * 12/2002 Hamada ............ G02F 1/133305
345/4
2006/0072063 A1 * 4/2006 Kim ...................... B82Y 20/00
349/156
(Continued)

FOREIGN PATENT DOCUMENTS

KR    1020120100881    9/2012
KR    1020130100316    9/2013
(Continued)

*Primary Examiner* — Angela K Davison
*Assistant Examiner* — Jonathan Y Jung
(74) *Attorney, Agent, or Firm* — F. Chau & Associates, LLC

(57) ABSTRACT

A flexible display apparatus includes a flexible substrate including a first surface, a second surface, a first side surface and a second side surface connected to the first side surface. A display layer is disposed on the first surface. A first substrate extension portion extends from the first side surface and is bent along the first side surface to overlap the flexible substrate. A second substrate extension portion extends from the second side surface and is bent along the second side surface to overlap the flexible substrate and the first substrate extension portion. First and second drivers provide driving signals to the display layer, wherein the first and second drivers are mounted on the first and second substrate extension portions, respectively. A first conductive connection member is disposed between the first and second substrate extension portions, electrically connecting the first extension portion with the second extension portion.

21 Claims, 13 Drawing Sheets

(51) Int. Cl.
*H01L 51/00* (2006.01)
*H01L 27/12* (2006.01)
*H01L 51/56* (2006.01)

(58) Field of Classification Search
CPC ........... G02F 1/133723; G02F 1/13394; G02F
2001/13398; G02F 1/13452; G02F
1/1345; G02F 1/13458; G02F 2201/121;
G02F 2202/22; G02F 1/134309; G06F
1/1652; G09G 2380/02; G09G
2300/0408; G09G 3/2096; H01L 51/0097;
H01L 51/56; H01L 2224/73104; H01L
2224/73204; H01L 22/32; H05K 1/147;
H05K 3/4007
See application file for complete search history.

(56) References Cited

U.S. PATENT DOCUMENTS

| | | | | |
|---|---|---|---|---|
| 2010/0182524 | A1* | 7/2010 | Nomura | G02F 1/133308 349/40 |
| 2011/0242476 | A1* | 10/2011 | Moriwaki | G02F 1/13394 349/153 |
| 2013/0002583 | A1* | 1/2013 | Jin | G06F 1/1637 345/173 |

FOREIGN PATENT DOCUMENTS

| | | |
|---|---|---|
| KR | 1020150031399 | 3/2015 |
| KR | 1020150094989 | 8/2015 |

* cited by examiner

FIG. 3
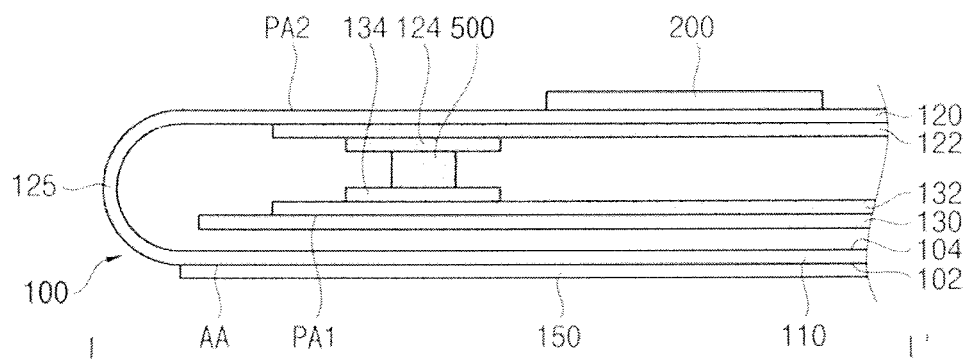
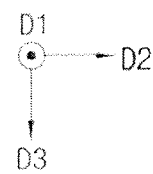
FIG. 4
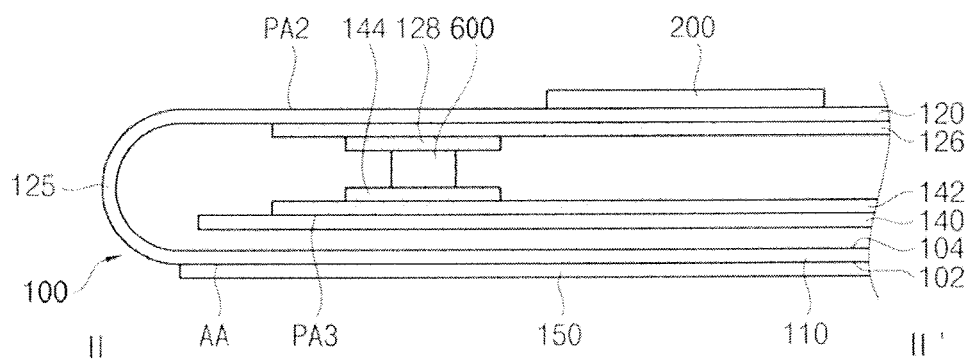
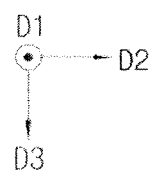

FIG. 5
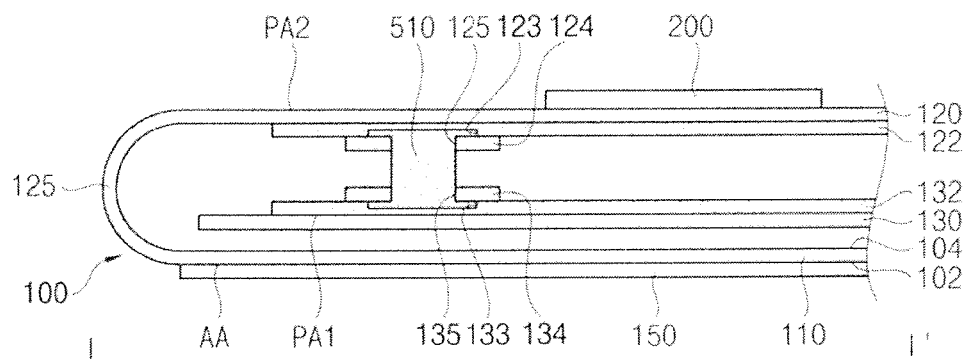
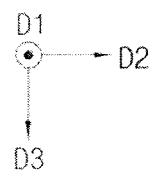
FIG. 6
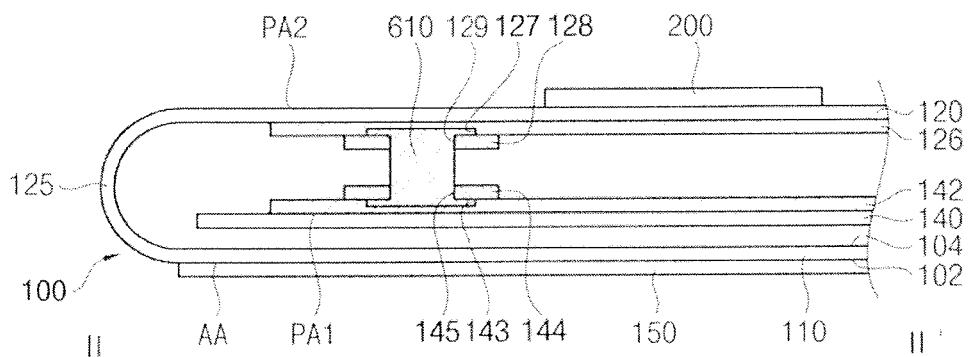
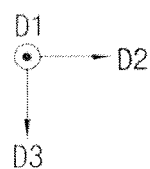

FIG. 7
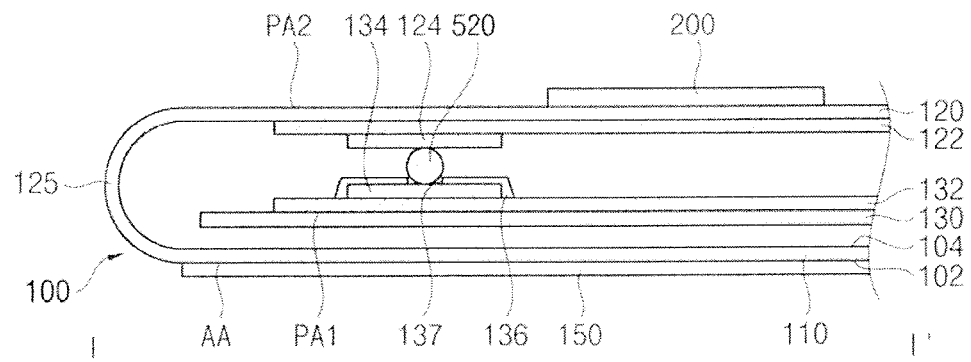
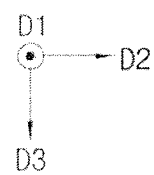
FIG. 8
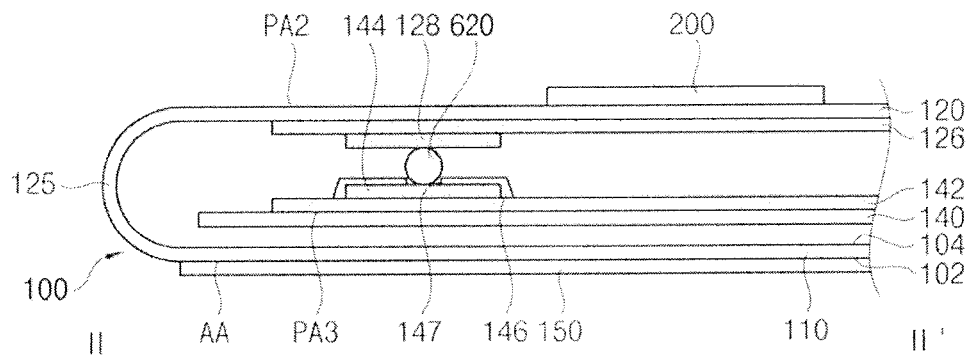
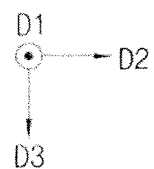

FIG. 15
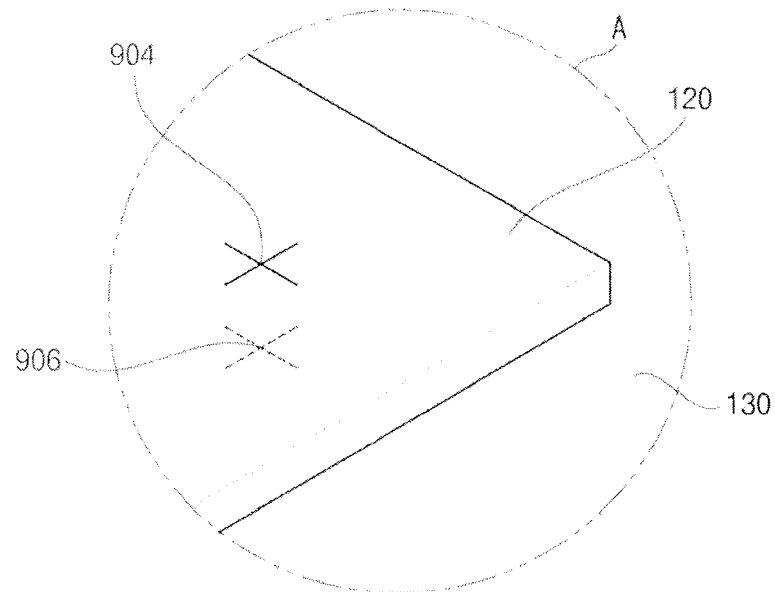
FIG. 16
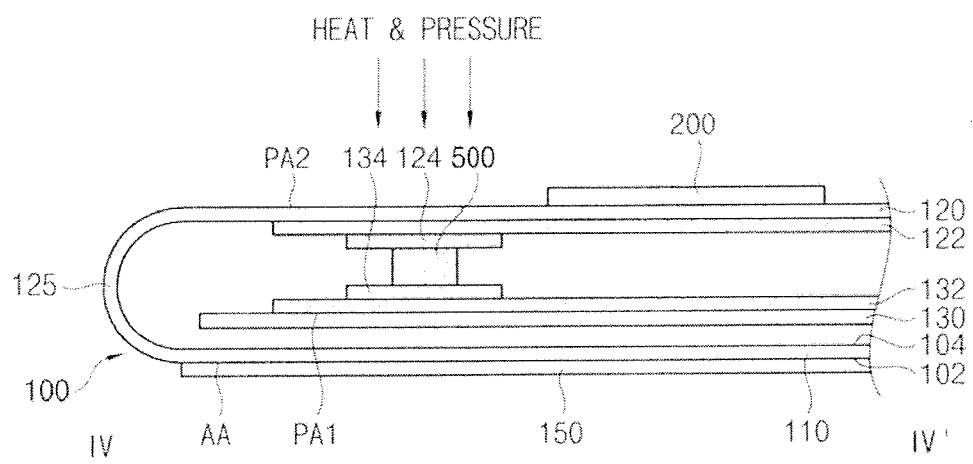
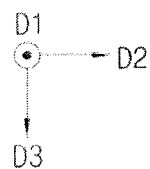

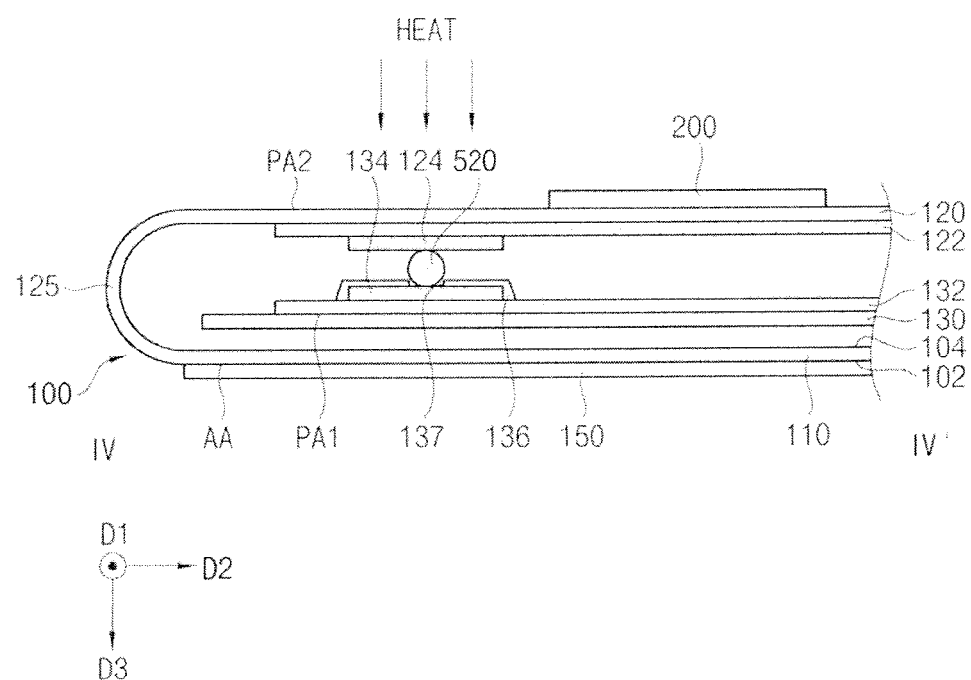

FLEXIBLE DISPLAY APPARATUS HAVING INCREASED ELECTRICAL CONNECTION RELIABILITY OF DISPLAY DRIVER AND METHOD OF MANUFACTURING THE SAME

CROSS-REFERENCE TO RELATED APPLICATION(S)

This application claims priority under 35 U.S.C. § 119 to Korean Patent Application No. 10-2015-0156621, filed on Nov. 9, 2015 in the Korean Intellectual Property Office (KIPO), the contents of which are herein incorporated by reference in their entirety.

TECHNICAL FIELD

Exemplary embodiments of the present invention relate to a flexible display apparatus. More particularly, exemplary embodiments of the present invention relate to a flexible display apparatus having an increased electrical connection reliability of a display driver.

DISCUSSION OF THE RELATED ART

A flexible display apparatus includes a flexible display panel and a driver applying a driving signal to the flexible display panel.

The driver may include a data driver, a scan driver and an emission driver. In addition, the flexible display apparatus may further include a plurality of wires disposed on the flexible display panel. The data, scan and emission drivers may be electrically connected to one another through the plurality of wires.

When the flexible display panel and the plurality of wires disposed on the flexible display panel are bent, a stress may be applied to the plurality of wires such that an electrical connection reliability of the wires decreases.

SUMMARY

According to an exemplary embodiment of the present invention, a flexible display apparatus includes a flexible substrate body including a first surface, a second surface opposite to the first surface, a first side surface and a second side surface connected to the first side surface. A display layer is disposed on the first surface of the flexible substrate body. A first substrate extension portion extends from the first side surface of the flexible substrate body and is bent along the first side surface of the flexible substrate body, the first substrate extension portion overlapping the flexible substrate body. A second substrate extension portion extends from the second side surface of the flexible substrate body and is bent along the second side surface of the flexible substrate body, the second substrate extension portion overlapping the flexible substrate body and the first substrate extension portion. First and second drivers provide driving signals to the display layer, wherein the first and second drivers are mounted on the first and second substrate extension portions, respectively. A first conductive connection member is disposed between the first and second substrate extension portions, the first conductive connection member electrically connecting the first extension portion with the second extension portion.

In an exemplary embodiment of the present invention, the first conductive connection member includes an anisotropic conductive film (ACF) material.

In an exemplary embodiment of the present invention, the first conductive connection member has a cylindrical shape or a spherical shape.

In an exemplary embodiment of the present invention, the first conductive connection member includes a conductive polymer material.

In an exemplary embodiment of the present invention, the first conductive connection member includes polyacetylene, polyparaphenylene, polypyrole or polyaniline.

In an exemplary embodiment of the present invention, the first conductive connection member includes a plurality of nano wires or a plurality of nano tubes.

In an exemplary embodiment of the present invention, the flexible display apparatus further includes a first conductive pad disposed on the first substrate extension portion, the first conductive pad electrically connecting the first conductive connection member with the first driver and making contact with the first conductive connection member.

In an exemplary embodiment of the present invention, the flexible display apparatus further includes an insulation guide layer covering a side surface and a first portion of a top surface of the first conductive pad, the insulation guide layer exposing a second portion of the top surface of the first conductive pad. A portion of the first conductive connection member passes through the insulation guide layer.

In an exemplary embodiment of the present invention, the flexible display apparatus further includes a second conductive pad disposed on the second substrate extension portion, the second conductive pad electrically connecting the first conductive connection member with the second driver and making contact with the first conductive connection member. The first conductive pad includes a first insertion hole in which a first side of the first conductive connection member is inserted and the second conductive pad includes a second insertion holes in which a second side of the first conductive connection member is inserted.

In an exemplary embodiment of the present invention, the flexible display apparatus further includes a first connection wire disposed on the first substrate extension portion, the first connection wire electrically connecting the first conductive pad and the first driver, and a second connection wire disposed on the second substrate extension portion, the second connection wire electrically connecting the second conductive pad and the second driver. The first side of the first conductive connection member is inserted in a third hole provided at the first connection wire, and the second side of the first conductive connection member is inserted in a fourth hole provided at the second connection wire.

In an exemplary embodiment of the present invention, the first and third insertion holes are connected to each other, and a cross-sectional size of the third insertion hole is greater than a cross-sectional size of the first insertion hole. The second and fourth insertion holes are connected to each other, and a cross-sectional size of the fourth insertion hole is greater than a cross-sectional size of the second insertion hole.

In an exemplary embodiment of the present invention, the first conductive connection member has a cross-sectional I shape.

In an exemplary embodiment of the present invention, the flexible display apparatus further includes a third substrate extension portion extending from a third side surface of the flexible substrate body and bent along the third side surface of the flexible substrate body, the third substrate extension portion overlapping the flexible substrate body and the second substrate extension portion, wherein the third side surface of the flexible substrate body is connected to the second side surface of the flexible substrate body and is opposite to the first side surface of the flexible substrate body. A third driver provides a driving signal to the display layer, wherein the third driver is mounted on the third substrate extension portion. A second conductive connection member is disposed between the second and third substrate extension portions, the second conductive connection member electrically connecting the second driver with the third driver.

In an exemplary embodiment of the present invention, the first driver is a scan driver, the second driver is a data driver, and the third driver is an emission driver.

In an exemplary embodiment of the present invention, the flexible display apparatus further includes a third conductive connection member disposed between the flexible substrate body and the first substrate extension portion, the third conductive connection member electrically connecting the first driver with the display layer.

In an exemplary embodiment of the present invention, the flexible substrate body, the first substrate extension portion and the second substrate extension portion include polyimide.

In an exemplary embodiment of the present invention, the display layer includes a liquid crystal layer or an organic light emitting layer.

According to an exemplary embodiment of the present invention, a method of manufacturing a flexible display apparatus includes providing a preliminary display apparatus including a flexible substrate body including a first surface and a second surface opposite to the first surface, a display layer disposed on the first surface of the flexible substrate body, a first preliminary substrate extension portion extending from a first side surface of the flexible substrate body, a second preliminary substrate extension portion extending from a second side surface of the flexible substrate body, and first and second drivers providing driving signals to the display layer, wherein the first driver is mounted on the first preliminary substrate extension portion, the second driver is mounted on the second preliminary substrate extension portion, and wherein the second side surface of the flexible substrate body is connected to the first side surface of the flexible substrate body. The first preliminary substrate extension portion is bent along the first side surface of the flexible substrate body such that a first substrate extension portion is formed to overlap the flexible substrate body. A conductive connection member is disposed on the first substrate extension portion. The second preliminary substrate extension portion is bent along the second side surface of the flexible substrate body such that a second substrate extension portion is formed to overlap the flexible substrate body and the first substrate extension portion. The first driver is electrically connected with the second driver through the conductive connection member.

In an exemplary embodiment of the present invention, the conductive connection member includes an anisotropic conductive film (ACF) material. Electrically connecting the first driver with the second driver includes performing a thermal compression process to electrically connect the first driver with the second driver through the conductive connection member.

In an exemplary embodiment of the present invention, the conductive connection member includes a liquid metal or a conductive polymer material. The conductive connection member is disposed on the first substrate extension portion by a dispenser or an inkjet printing process.

BRIEF DESCRIPTION OF THE DRAWINGS

The above and other features and aspects of the present invention will become more clearly understood by describing in detail exemplary embodiments thereof in conjunction with the accompanying drawings, in which:

FIG. 3 is a cross-sectional view cut along the line I-I' of FIG. 1, according to an exemplary embodiment of the present invention;

FIG. 4 is a cross-sectional view cut along the line II-II' of FIG. 1, according to an exemplary embodiment of the present invention;

FIG. 5 is a cross-sectional view cut along the line I-I' of FIG. 1 illustrating a flexible display apparatus according to an exemplary embodiment of the present invention;

FIG. 6 is a cross-sectional view cut along the line II-II' of FIG. 1, according to an exemplary embodiment of the present invention;

FIG. 7 is a cross-sectional view cut along the line I-I' of FIG. 1 illustrating a flexible display apparatus according to an exemplary embodiment of the present invention;

FIG. 8 is a cross-sectional view cut along the line II-II' of FIG. 1, according to an exemplary embodiment of the present invention;

FIG. 15 is an enlarged view of region A of FIG. 14, according to an exemplary embodiment of the present invention;

FIG. 16 is a cross-sectional view cut along the line IV-IV' of FIG. 14, according to an exemplary embodiment of the present invention;

FIG. 18 is a cross-sectional view cut along the line IV-IV' of FIG. 14 illustrating a method of manufacturing a flexible display apparatus, according to an exemplary embodiment of the present invention.

DETAILED DESCRIPTION OF THE EMBODIMENTS

Figure 1:
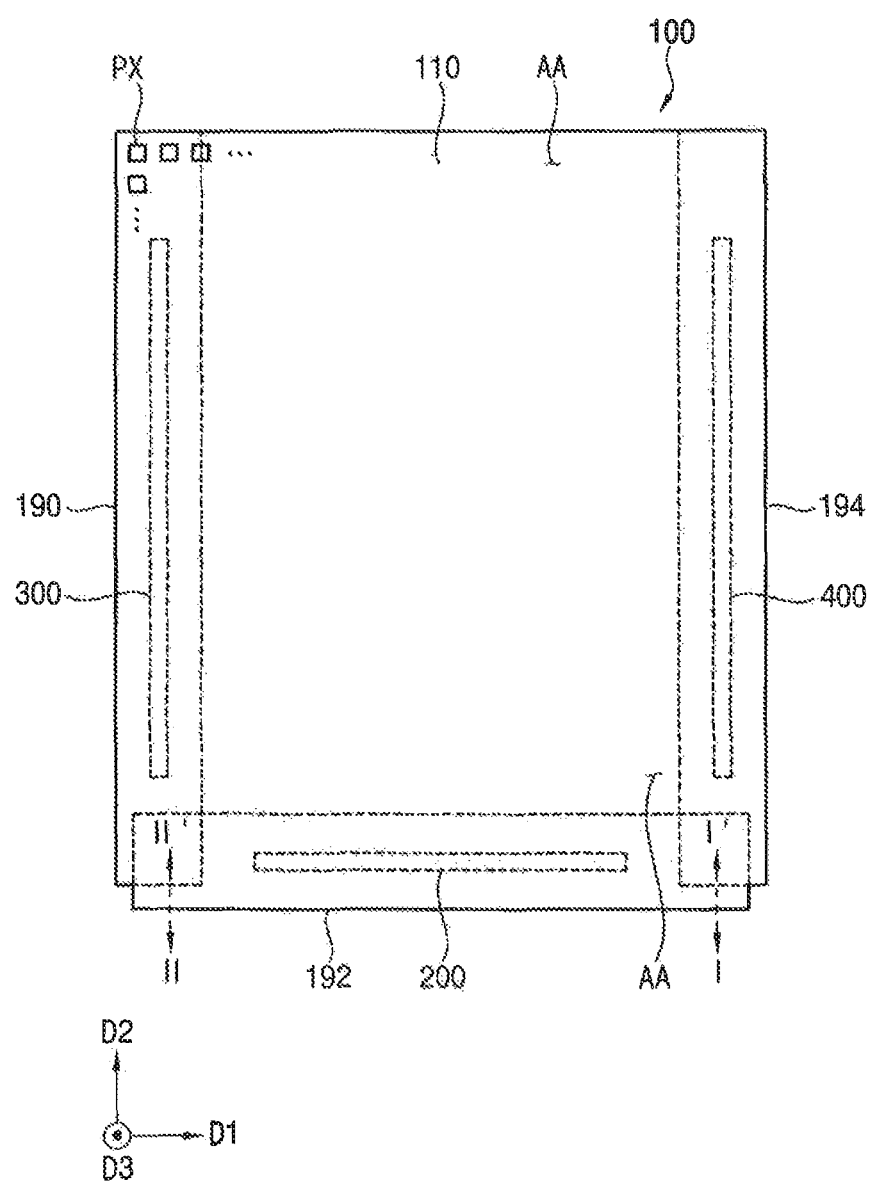
FIG. 1 is a plan view illustrating a flexible display apparatus according to an exemplary embodiment of the present invention.

Exemplary embodiments of the present invention will be described more fully hereinafter with reference to the accompanying drawings. The present invention may, however, be embodied in many different forms and should not be construed as being limited to the disclosed exemplary embodiments. The exemplary embodiments of the present invention are provided to convey the scope of the inventive concept to those skilled in the art. Like reference numerals refer to like elements throughout this application.

Figure 2:
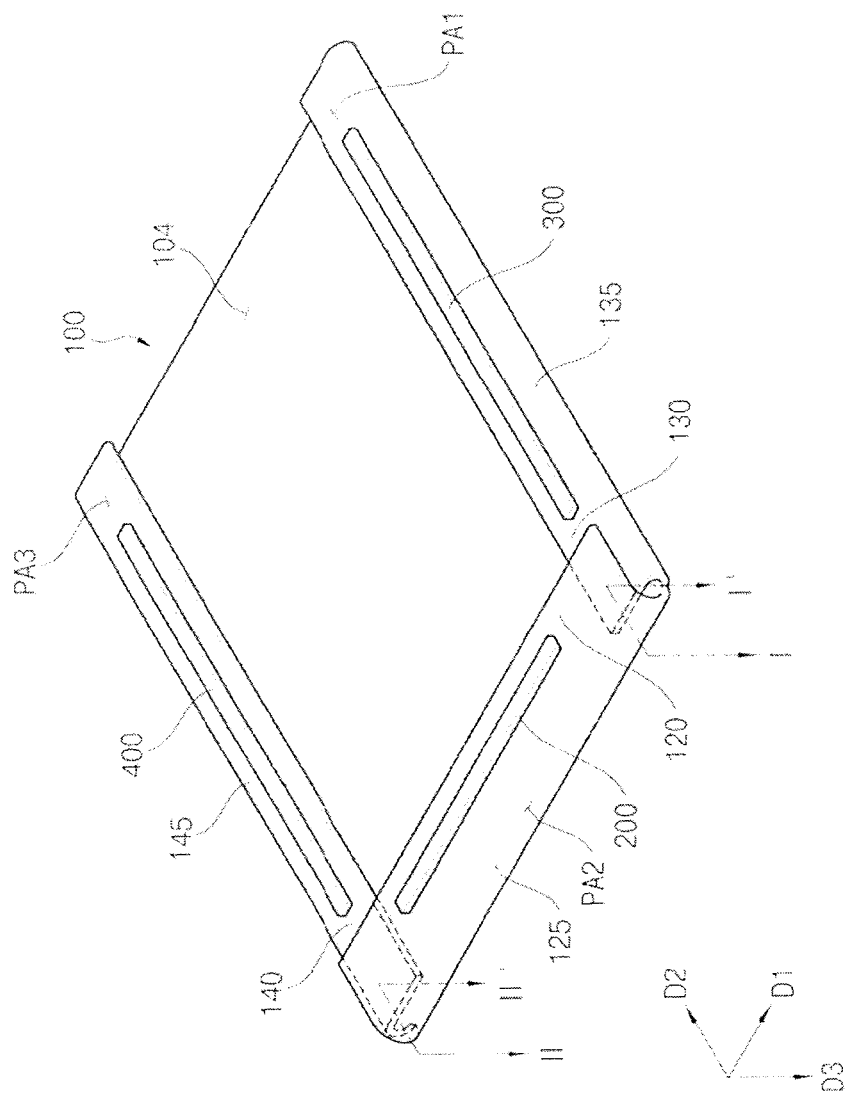
FIG. 2 is a perspective view illustrating the flexible display apparatus of FIG. 1, according to an exemplary embodiment of the present invention.

FIG. 1 is a plan view illustrating a flexible display apparatus according to an exemplary embodiment of the present invention. FIG. 2 is a perspective view illustrating the flexible display apparatus of FIG. 1, according to an exemplary embodiment of the present invention. FIG. 3 is a cross-sectional view cut along the line I-I' of FIG. 1, according to an exemplary embodiment of the present invention. FIG. 4 is a cross-sectional view cut along the line II-II' of FIG. 1, according to an exemplary embodiment of the present invention.

Referring to FIGS. 1 to 4, a flexible display apparatus includes a flexible display panel 100 and a driver applying a driving signal to the flexible display panel 100. The driver may include a data driver 200, a scan driver 300 and an emission driver 400.

The flexible display apparatus may further include a first conductive connection member 500 connecting the scan driver 300 with the data driver 200 and a second conductive connection member 600 connecting the data driver 200 with the emission driver 400.

The flexible display apparatus may further include first and second emission lines electrically connected to the emission driver 400.

The flexible display apparatus may further include a power supply providing power and power lines connected to the power supply.

The flexible display panel 100 may include a flexible substrate body 110, a display layer 150 and first to third substrate extension portions 130, 120 and 140.

The flexible display panel 100 includes an active region AA on which an image is displayed and first to third peripheral regions PA1, PA2 and PA3 adjacent to the active region AA and not displaying the image. The active region AA may be referred to as a display region.

The active region AA may correspond to the flexible substrate body 110. The first peripheral region PA1 may correspond to the first substrate extension portion 130. The second peripheral region PA2 may correspond to the second substrate extension portion 120. The third peripheral region PA3 may correspond to the third substrate extension portion 140.

The flexible display panel 100 includes a plurality of scan lines, each of which extends in a first direction D1, and a plurality of data lines, each of which extends in a second direction D2 crossing the first direction D1. The flexible display panel 100 includes a plurality of pixels PX. The pixels PX are electrically connected to the scan lines and the data lines. The scan lines, the data lines and the pixels PX are disposed in the active region AA of the flexible display panel 100.

In addition, the pixels PX may be disposed in a matrix form. The scan lines may be electrically connected to the scan driver 300. The data lines may be electrically connected to the data driver 200. Each pixel PX may include a switching element.

The data driver 200 may provide a reference voltage or a pixel data voltage as a data signal to the data lines. The data driver 200 may be mounted on the second substrate extension portion 120.

The scan driver 300 may simultaneously provide a scan signal to the scan lines. The scan driver 300 may be mounted on the first substrate extension portion 130.

The emission driver 400 may provide first and second emission signals to the pixels PX via the first and second emission lines. The emission driver 400 may be mounted on the third substrate extension portion 140.

The flexible substrate body 110 may include a first surface 102 and a second surface 104 opposite to the first surface 102. The flexible substrate body 110 may include polyimide.

The display layer 150 may be disposed under the first surface 102 of the flexible substrate body 110. In an exemplary embodiment of the present invention, the display layer 150 may include an organic light emitting layer. Alternatively, the display layer 150 may include a liquid crystal layer.

The first substrate extension portion 130 may extend from a first side surface 190 (refer to FIG. 11) of the flexible substrate body 110 and may be bent along the first side surface 190 of the flexible substrate body 110. The first substrate extension portion 130 may extend over the second surface 104 of the flexible substrate body 110. The first substrate extension portion 130 may overlap the flexible substrate body 110.

For example, the first substrate extension portion 130 may include polyimide. In addition, the first substrate extension portion 130 may further include a first bending portion 135 bent along the first side surface 190 of the flexible substrate body 110.

The second substrate extension portion 120 may extend from a second side surface 192 (refer to FIG. 11) of the flexible substrate body 110 and may be bent along the second side surface 192 of the flexible substrate body 110. The second substrate extension portion 120 may extend over the second surface 104 of the flexible substrate body 110. The second substrate extension portion 120 may overlap the flexible substrate body 110.

For example, the second substrate extension portion 120 may include polyimide. In addition, the second substrate extension portion 120 may further include a second bending portion 125 bent along the second side surface 192 of the flexible substrate body 110.

The third substrate extension portion 140 may extend from a third side surface 194 (refer to FIG. 11) of the flexible substrate body 110 and may be bent along the third side surface 194 of the flexible substrate body 110. The third substrate extension portion 140 may extend over the second surface 104 of the flexible substrate body 110. The third substrate extension portion 140 may overlap the flexible substrate body 110.

For example, the third substrate extension portion 140 may include polyimide. In addition, the third substrate extension portion 140 may further include a third bending portion 145 bent along the third side surface 194 of the flexible substrate body 110.

The first conductive connection member 500 may be interposed between the first substrate extension portion 130 and the second substrate extension portion 120. The first conductive connection member 500 may electrically connect the data driver 200 with the scan driver 300.

In addition, the flexible display apparatus may further include a first conductive pad 134 and a first connection wire 132. The first conductive pad 134 may be disposed on the first substrate extension portion 130, and the first conductive pad 134 may make contact with the first conductive connection member 500. The first connection wire 132 may be disposed on the first substrate extension portion 130. The first connection wire 132 may electrically connect the first conductive pad 134 with the scan driver 300.

The flexible display apparatus may further include a second conductive pad 124 and a second connection wire 122. The second conductive pad 124 may be disposed under the second substrate extension portion 120, and the second conductive pad 124 may make contact with the first conductive connection member 500. The second connection wire 122 may be disposed under the second substrate extension portion 120. The second connection wire 122 may electrically connect the second conductive pad 124 with the data driver 200.

The second conductive connection member 600 may be interposed between the second substrate extension portion 120 and the third substrate extension portion 140. The second conductive connection member 600 may electrically connect the data driver 200 with the emission driver 400.

In addition, the flexible display apparatus may further include a third conductive pad 144 and a third connection wire 142. The third conductive pad 144 may be disposed on the third substrate extension portion 140, and the third conductive pad 144 may make contact with the second conductive connection member 600. The third connection wire 142 may be disposed on the third substrate extension portion 140. The third connection wire 142 may electrically connect the third conductive pad 144 with the emission driver 400.

The flexible display apparatus may further include a fourth conductive pad 128 and a fourth connection wire 126. The fourth conductive pad 128 may be disposed under the second substrate extension portion 120, and the fourth conductive pad 128 may make contact with the second conductive connection member 600. The fourth connection wire 126 may be disposed under the second substrate extension portion 120. The fourth connection wire 126 may electrically connect the fourth conductive pad 128 with the data driver 200.

In an exemplary embodiment of the present invention, each of the first and second conductive connection members 500 and 600 may include an anisotropic conductive film (ACF) material. In addition, each of the first and second conductive connection members 500 and 600 may have a cylindrical shape or a spherical shape.

Alternatively, each of the first and second conductive connection members 500 and 600 may include a conductive polymer material. For example, each of the first and second conductive connection members 500 and 600 may include polyacetylene, polyparaphenylene, polypyrole or polyaniline.

In an exemplary embodiment of the present invention, each of the first and second conductive connection members 500 and 600 may include a plurality of nano wires or a plurality of nano tubes. For example, each of the first and second conductive connection members 500 and 600 may include silver (Ag) or gold (Au). Each of the first and second conductive connection members 500 and 600 may include silver nano wires or gold nano wires.

According to the flexible display apparatus, the first substrate extension portion 130 may overlap the second substrate extension portion 120. The scan driver 300 mounted on the first substrate extension portion 130 and the data driver 200 mounted on the second substrate extension portion 120 may be electrically connected to each other through the first conductive connection member 500.

In addition, the second substrate extension portion 120 may overlap the third substrate extension portion 140. The emission driver 400 mounted on the third substrate extension portion 140 and the data driver 200 mounted on the second substrate extension portion 120 may be electrically connected to each other through the second conductive connection member 600.

Accordingly, a bending stress which is applied to the wires 132, 122, 142 and 126 connecting electrically the drivers 200, 300 and 400 may be reduced such that an electrical connection reliability of the flexible display apparatus is increased.

FIG. 5 is a cross-sectional view cut along the line I-I' of FIG. 1 illustrating a flexible display apparatus according to an exemplary embodiment of the present invention. FIG. 6 is a cross-sectional view cut along the line II-II' of FIG. 1, according to an exemplary embodiment of the present invention. The flexible display apparatus of FIGS. 5 and 6 may be substantially the same as that of FIGS. 1 to 4, except for a shape of each of first and second conductive connection members, a shape of each of first to fourth connection pads and a shape of each of first to fourth connection wires. Thus, like reference numerals may refer to like elements, and repetitive descriptions thereof may be omitted for brevity.

Referring to FIGS. 1, 2, 5 and 6, a flexible display apparatus includes a flexible display panel 100 and a driver applying a driving signal to the flexible display panel 100. The driver may include a data driver 200, a scan driver 300 and an emission driver 400.

The flexible display apparatus may further include a first conductive connection member 510 connecting the scan driver 300 with the data driver 200 and a second conductive connection member 610 connecting the data driver 200 with the emission driver 400.

The flexible display panel 100 may include a flexible substrate body 110, a display layer 150 and first to third substrate extension portions 130, 120 and 140.

The flexible substrate body 110 may include a first surface 102 and a second surface 104 opposite to the first surface 102. The flexible substrate body 110 may include polyimide.

The display layer 150 may be disposed under the first surface 102 of the flexible substrate body 110. In an exemplary embodiment of the present invention, the display layer 150 may include an organic light emitting layer. Alternatively, the display layer 150 may include a liquid crystal layer.

The first conductive connection member 510 may be interposed between the first substrate extension portion 130 and the second substrate extension portion 120. The first conductive connection member 510 may electrically connect the data driver 200 with the scan driver 300.

In addition, the flexible display apparatus may further include a first conductive pad 134 and a first connection wire 132. The first conductive pad 134 may be disposed on the first substrate extension portion 130, and the first conductive pad 134 may make contact with the first conductive connection member 510. The first connection wire 132 may be disposed on the first substrate extension portion 130. The first connection wire 132 may electrically connect the first conductive pad 134 with the scan driver 300.

Each of the first conductive pad 134 and the first connection wire 132 may further include a respective one of first and third insertion holes 135 and 133 in which the first conductive connection member 510 is inserted. The first and third insertion holes 135 and 133 may be connected to each other. A cross-sectional size of the third insertion hole 133 of the first connection wire 132 may be greater than a cross-sectional size of the first insertion hole 135 of the first conductive pad 134.

The flexible display apparatus may further include a second conductive pad 124 and a second connection wire 122. The second conductive pad 124 may be disposed under the second substrate extension portion 120, and the second conductive pad 124 may make contact with the first conductive connection member 510. The second connection wire 122 may be disposed under the second substrate extension portion 120. The second connection wire 122 may electrically connect the second conductive pad 124 with the data driver 200.

Each of the second conductive pad 124 and the second connection wire 122 may further include a respective one of second and fourth insertion holes 125 and 123 in which the first conductive connection member 510 is inserted. The second and fourth insertion holes 125 and 123 may be connected to each other. A cross-sectional size of the fourth insertion hole 123 of the second connection wire 122 may be greater than a cross-sectional size of the second insertion hole 125 of the second conductive pad 124.

The second conductive connection member 610 may be interposed between the second substrate extension portion 120 and the third substrate extension portion 140. The second conductive connection member 610 may electrically connect the data driver 200 with the emission driver 400.

In addition, the flexible display apparatus may further include a third conductive pad 144 and a third connection wire 142. The third conductive pad 144 may be disposed on the third substrate extension portion 140, and the third conductive pad 144 may make contact with the second conductive connection member 610. The third connection wire 142 may be disposed on the third substrate extension portion 140. The third connection wire 142 may electrically connect the third conductive pad 144 with the emission driver 400.

Each of the third conductive pad 144 and the third connection wire 142 may further include a respective one of first and third insertion holes 145 and 143 in which the second conductive connection member 610 is inserted. The first and third insertion holes 145 and 143 may be connected to each other. A cross-sectional size of the third insertion hole 143 of the third connection wire 142 may be greater than a cross-sectional size of the first insertion hole 145 of the third conductive pad 144.

The flexible display apparatus may further include a fourth conductive pad 128 and a fourth connection wire 126. The fourth conductive pad 128 may be disposed under the second substrate extension portion 120, and the fourth conductive pad 128 may make contact with the second conductive connection member 610. The fourth connection wire 126 may be disposed under the second substrate extension portion 120. The fourth connection wire 126 may electrically connect the fourth conductive pad 128 with the data driver 200.

Each of the fourth conductive pad 128 and the fourth connection wire 126 may further include a respective one of second and fourth insertion holes 129 and 127 in which the second conductive connection member 610 is inserted. The second and fourth insertion holes 129 and 127 may be connected to each other. A cross-sectional size of the fourth insertion hole 127 of the fourth connection wire 126 may be greater than a cross-sectional size of the second insertion hole 129 of the fourth conductive pad 128.

In an exemplary embodiment of the present invention, each of the first and second conductive connection members 510 and 610 may have a cross-sectional I shape.

In an exemplary embodiment of the present invention, each of the first and second conductive connection members 510 and 610 may include an ACF material.

Alternatively, each of the first and second conductive connection members 510 and 610 may include a conductive polymer material. For example, each of the first and second conductive connection members 510 and 610 may include polyacetylene, polyparaphenylene, polypyrole or polyaniline.

In an exemplary embodiment of the present invention, each of the first and second conductive connection members 510 and 610 may include a plurality of nano wires or a plurality of nano tubes. For example, each of the first and second conductive connection members 510 and 610 may include silver (Ag) or gold (Au). Each of the first and second conductive connection members 510 and 610 may include silver nano wires or gold nano wires.

According to the flexible display apparatus, the first substrate extension portion 130 may overlap the second substrate extension portion 120. The scan driver 300 mounted on the first substrate extension portion 130 and the data driver 200 mounted on the second substrate extension portion 120 may be electrically connected to each other through the first conductive connection member 510.

In addition, the second substrate extension portion 120 may overlap the third substrate extension portion 140. The emission driver 400 mounted on the third substrate extension portion 140 and the data driver 200 mounted on the second substrate extension portion 120 may be electrically connected to each other through the second conductive connection member 610.

Accordingly, a bending stress which is applied to the wires 132, 122, 142 and 126 connecting electrically the drivers 200, 300 and 400 may be reduced such that an electrical connection reliability of the flexible display apparatus is increased.

Each of the first and second conductive connection members 510 and 610 may have a cross-sectional I shape such that the electrical connection reliability of the flexible display apparatus is increased.

FIG. 7 is a cross-sectional view cut along the line I-I' of FIG. 1 illustrating a flexible display apparatus according to an exemplary embodiment of the present invention. FIG. 8 is a cross-sectional view cut along the line II-II' of FIG. 1, according to an exemplary embodiment of the present invention. A flexible display apparatus of FIGS. 7 and 8 may be substantially the same as that of FIGS. 1 to 4, except for a shape of each of first and second conductive connection members and an insulation guide layer. Thus, like reference numerals may refer to like elements, and repetitive descriptions thereof may be omitted for brevity.

Referring to FIGS. 1, 2, 7 and 8, a flexible display apparatus includes a flexible display panel 100 and a driver applying a driving signal to the flexible display panel 100. The driver may include a data driver 200, a scan driver 300 and an emission driver 400.

The flexible display apparatus may further include a first conductive connection member 520 connecting the scan driver 300 with the data driver 200 and a second conductive connection member 620 connecting the data driver 200 with the emission driver 400.

The flexible display panel 100 may include a flexible substrate body 110, a display layer 150 and first to third substrate extension portions 130, 120 and 140.

The flexible substrate body 110 may include a first surface 102 and a second surface 104 opposite to the first surface 102. The flexible substrate body 110 may include polyimide.

The display layer 150 may be disposed under the first surface 102 of the flexible substrate body 110. In an exemplary embodiment of the present invention, the display layer 150 may include an organic light emitting layer. Alternatively, the display layer 150 may include a liquid crystal layer.

The first conductive connection member 520 may be interposed between the first substrate extension portion 130 and the second substrate extension portion 120. The first conductive connection member 520 may electrically connect the data driver 200 with the scan driver 300.

In addition, the flexible display apparatus may further include a first conductive pad 134 and a first connection wire 132. The first conductive pad 134 may be disposed on the first substrate extension portion 130, and the first conductive pad 134 may make contact with the first conductive connection member 520. The first connection wire 132 may be disposed on the first substrate extension portion 130. The first connection wire 132 may electrically connect the first conductive pad 134 with the scan driver 300.

In an exemplary embodiment of the present invention, the flexible display apparatus may further include an insulation guide layer 136 covering a side surface and a first portion of a top surface of the first conductive pad 134. The insulation guide layer 136 may expose a second portion of the top surface of the first conductive pad 134.

For example, the insulation guide layer 136 may include a guide hole 137 in which at least a portion of the first conductive connection member 520 is inserted. The insulation guide layer 136 may include polyimide.

The flexible display apparatus may further include a second conductive pad 124 and a second connection wire 122. The second conductive pad 124 may be disposed under the second substrate extension portion 120, and the second conductive pad 124 may make contact with the first conductive connection member 520. The second connection wire 122 may be disposed under the second substrate extension portion 120. The second connection wire 122 may electrically connect the second conductive pad 124 with the data driver 200.

The second conductive connection member 620 may be interposed between the second substrate extension portion 120 and the third substrate extension portion 140. The second conductive connection member 620 may electrically connect the data driver 200 with the emission driver 400.

In addition, the flexible display apparatus may further include a third conductive pad 144 and a third connection wire 142. The third conductive pad 144 may be disposed on the third substrate extension portion 140, and the third conductive pad 144 may make contact with the second conductive connection member 620. The third connection wire 142 may be disposed on the third substrate extension portion 140. The third connection wire 142 may electrically connect the third conductive pad 144 with the emission driver 400.

In an exemplary embodiment of the present invention, the flexible display apparatus may further include an insulation guide layer 146 covering a side surface and a first portion of a top surface of the third conductive pad 144. The insulation guide layer 146 may expose a second portion of the top surface of the third conductive pad 144.

For example, the insulation guide layer 146 may include a guide hole 147 in which at least a portion of the second conductive connection member 620 is inserted. The insulation guide layer 146 may include polyimide.

The flexible display apparatus may further include a fourth conductive pad 128 and a fourth connection wire 126. The fourth conductive pad 128 may be disposed under the second substrate extension portion 120, and the fourth conductive pad 128 may make contact with the second conductive connection member 620. The fourth connection wire 126 may be disposed under the second substrate extension portion 120. The fourth connection wire 126 may electrically connect the fourth conductive pad 128 with the data driver 200.

In an exemplary embodiment of the present invention, each of the first and second conductive connection members 520 and 620 may have a spherical shape.

In an exemplary embodiment of the present invention, each of the first and second conductive connection members 520 and 620 may include an ACF material.

Alternatively, each of the first and second conductive connection members 520 and 620 may include a conductive polymer material. For example, each of the first and second conductive connection members 520 and 620 may include polyacetylene, polyparaphenylene, polypyrole or polyaniline.

In an exemplary embodiment of the present invention, each of the first and second conductive connection members 520 and 620 may include a plurality of nano wires or a plurality of nano tubes. For example, each of the first and second conductive connection members 520 and 620 may include silver (Ag) or gold (Au). Each of the first and second conductive connection members 520 and 620 may include silver nano wires or gold nano wires.

According to the flexible display apparatus, the first substrate extension portion 130 may overlap the second substrate extension portion 120. The scan driver 300 mounted on the first substrate extension portion 130 and the data driver 200 mounted on the second substrate extension portion 120 may be electrically connected to each other through the first conductive connection member 520.

In addition, the second substrate extension portion 120 may overlap the third substrate extension portion 140. The emission driver 400 mounted on the third substrate extension portion 140 and the data driver 200 mounted on the second substrate extension portion 120 may be electrically connected to each other through the second conductive connection member 620.

Accordingly, a bending stress which is applied to the wires 132, 122, 142 and 126 connecting electrically the drivers 200, 300 and 400 may be reduced such that an electrical connection reliability of the flexible display apparatus is increased.

Each of the first and second conductive connection members 520 and 620 may have a spherical shape such that each of the first and second conductive connection members 520 and 620 is inserted in a respective one of the insulation guide layers 136 and 146 and the electrical connection reliability of the flexible display apparatus is increased.

Figure 9:
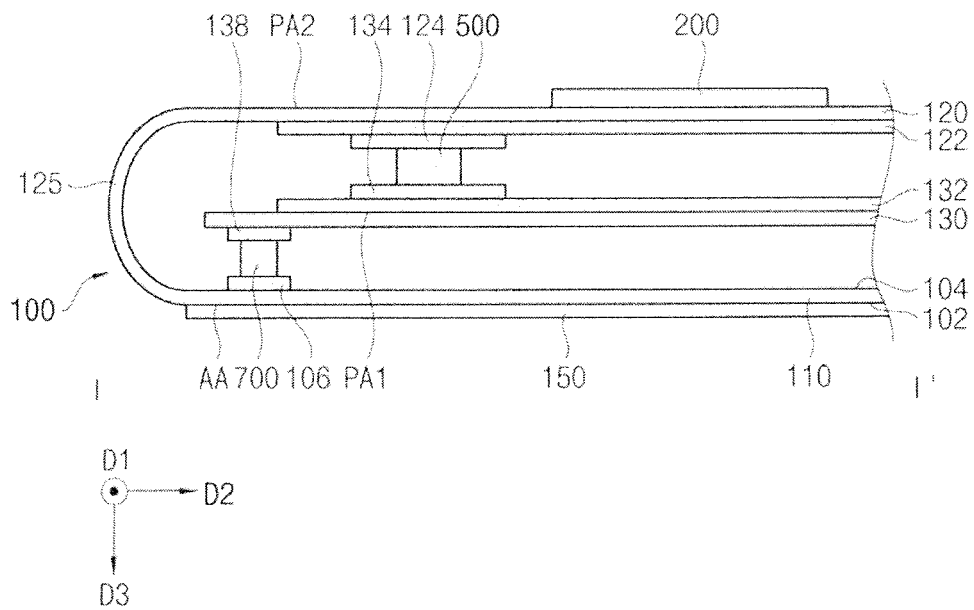
FIG. 9 is a cross-sectional view cut along the line I-I' of FIG. 1 illustrating a flexible display apparatus according to an exemplary embodiment of the present invention.
Figure 10:
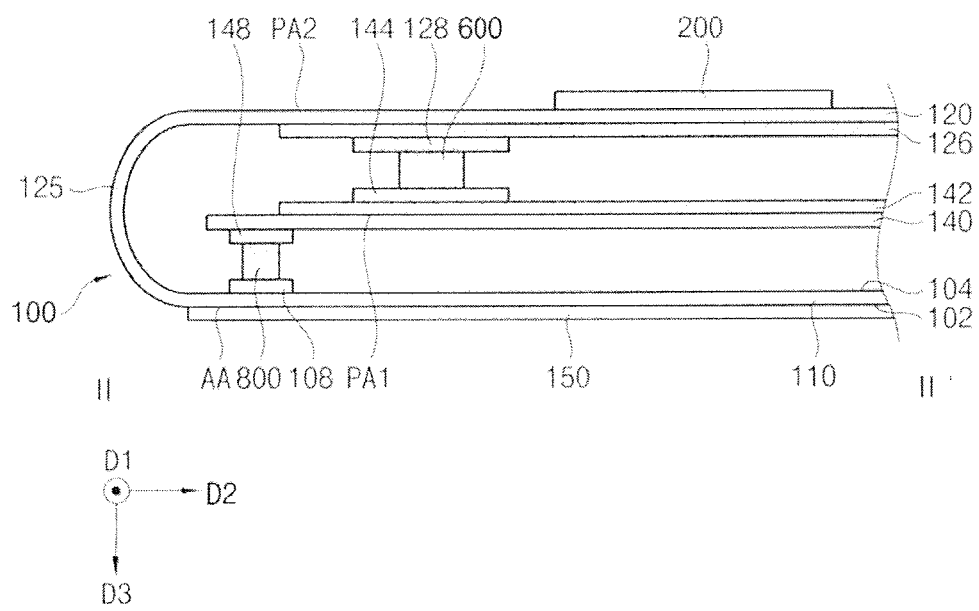
FIG. 10 is a cross-sectional view cut along the line II-II' of FIG. 1, according to an exemplary embodiment of the present invention.

FIG. 9 is a cross-sectional view cut along the line I-I' of FIG. 1 illustrating a flexible display apparatus according to an exemplary embodiment of the present invention. FIG. 10 is a cross-sectional view cut along the line II-II' of FIG. 1, according to an exemplary embodiment of the present invention. A flexible display apparatus of FIGS. 9 and 10 may be substantially the same as that of FIGS. 1 to 4, except for a third conductive connection member. Thus, like reference numerals may refer to like elements, and repetitive descriptions thereof may be omitted for brevity.

Referring to FIGS. 1, 2, 9 and 10, a flexible display apparatus includes a flexible display panel 100 and a driver applying a driving signal to the flexible display panel 100. The driver may include a data driver 200, a scan driver 300 and an emission driver 400.

The flexible display apparatus may further include a first conductive connection member 500 connecting the scan driver 300 with the data driver 200 and a second conductive connection member 600 connecting the data driver 200 with the emission driver 400.

In addition, the flexible display apparatus may further include a third conductive connection member 700 connecting the scan driver 300 with a display layer 150 and a fourth conductive connection member 800 connecting the emission driver 400 with the display layer 150.

The flexible display panel 100 may include a flexible substrate body 110, the display layer 150 and first to third substrate extension portions 130, 120 and 140.

The flexible substrate body 110 may include a first surface 102 and a second surface 104 opposite to the first surface 102. The flexible substrate body 110 may include polyimide.

The display layer 150 may be disposed under the first surface 102 of the flexible substrate body 110. In an exemplary embodiment of the present invention, the display layer 150 may include an organic light emitting layer. Alternatively, the display layer 150 may include a liquid crystal layer.

The first conductive connection member 500 may be interposed between the first substrate extension portion 130 and the second substrate extension portion 120. The first conductive connection member 500 may electrically connect the data driver 200 with the scan driver 300.

In addition, the flexible display apparatus may further include a first conductive pad 134 and a first connection wire 132. The first conductive pad 134 may be disposed on the first substrate extension portion 130, and the first conductive pad 134 may make contact with the first conductive connection member 500. The first connection wire 132 may be disposed on the first substrate extension portion 130. The first connection wire 132 may electrically connect the first conductive pad 134 with the scan driver 300.

The flexible display apparatus may further include a second conductive pad 124 and a second connection wire 122. The second conductive pad 124 may be disposed under the second substrate extension portion 120, and the second conductive pad 124 may make contact with the first conductive connection member 500. The second connection wire 122 may be disposed under the second substrate extension portion 120. The second connection wire 122 may electrically connect the second conductive pad 124 with the data driver 200.

The second conductive connection member 600 may be interposed between the second substrate extension portion 120 and the third substrate extension portion 140. The second conductive connection member 600 may electrically connect the data driver 200 with the emission driver 400.

In addition, the flexible display apparatus may further include a third conductive pad 144 and a third connection wire 142. The third conductive pad 144 may be disposed on the third substrate extension portion 140, and the third conductive pad 144 may make contact with the second conductive connection member 600. The third connection wire 142 may be disposed on the third substrate extension portion 140. The third connection wire 142 may electrically connect the third conductive pad 144 with the emission driver 400.

The flexible display apparatus may further include a fourth conductive pad 128 and a fourth connection wire 126. The fourth conductive pad 128 may be disposed under the second substrate extension portion 120, and the fourth conductive pad 128 may make contact with the second conductive connection member 600. The fourth connection wire 126 may be disposed under the second substrate extension portion 120. The fourth connection wire 126 may electrically connect the fourth conductive pad 128 with the data driver 200.

The third conductive connection member 700 may be interposed between the first substrate extension portion 130 and the flexible substrate body 110. The third conductive connection member 700 may electrically connect the scan driver 300 with the display layer 150.

In addition, the flexible display apparatus may further include a fifth conductive pad 106 and a sixth conductive pad 138. The fifth conductive pad 106 may be disposed on the second surface 104 of the flexible substrate body 110, and the sixth conductive pad 138 may be disposed under the first substrate extension portion 130. The fifth and sixth conductive pads 106 and 138 may make contact with the third conductive connection member 700.

The fourth conductive connection member 800 may be interposed between the third substrate extension portion 140 and the flexible substrate body 110. The fourth conductive connection member 800 may electrically connect the emission driver 400 with the display layer 150.

In addition, the flexible display apparatus may further include a seventh conductive pad 108 and an eighth conductive pad 148. The seventh conductive pad 108 may be disposed on the second surface 104 of the flexible substrate body 110, and the eighth conductive pad 148 may be disposed under the third substrate extension portion 140. The seventh and eighth conductive pads 108 and 148 may make contact with the fourth conductive connection member 800.

In an exemplary embodiment of the present invention, each of the first to fourth conductive connection members 500, 600, 700 and 800 may have a cylindrical shape.

In an exemplary embodiment of the present invention, each of the first to fourth conductive connection members 500, 600, 700 and 800 may include an ACF material.

Alternatively, each of the first to fourth conductive connection members 500, 600, 700 and 800 may include a conductive polymer material. For example, each of the first to fourth conductive connection members 500, 600, 700 and 800 may include polyacetylene, polyparaphenylene, polypyrole or polyaniline.

In an exemplary embodiment of the present invention, each of the first to fourth conductive connection members 500, 600, 700 and 800 may include a plurality of nano wires or a plurality of nano tubes. For example, each of the first to fourth conductive connection members 500, 600, 700 and 800 may include silver (Ag) or gold (Au). Each of the first to fourth conductive connection members 500, 600, 700 and 800 may include silver nano wires or gold nano wires.

According to the flexible display apparatus, through the first to fourth conductive connection members 500, 600, 700 and 800, the scan driver 300, the data driver 200, the emission driver 400 and the display layer 150 may be electrically connected to one another.

Accordingly, a bending stress which is applied to the wires 132, 122, 142 and 126 may be reduced such that an electrical connection reliability of the flexible display apparatus is increased.

Figure 11:
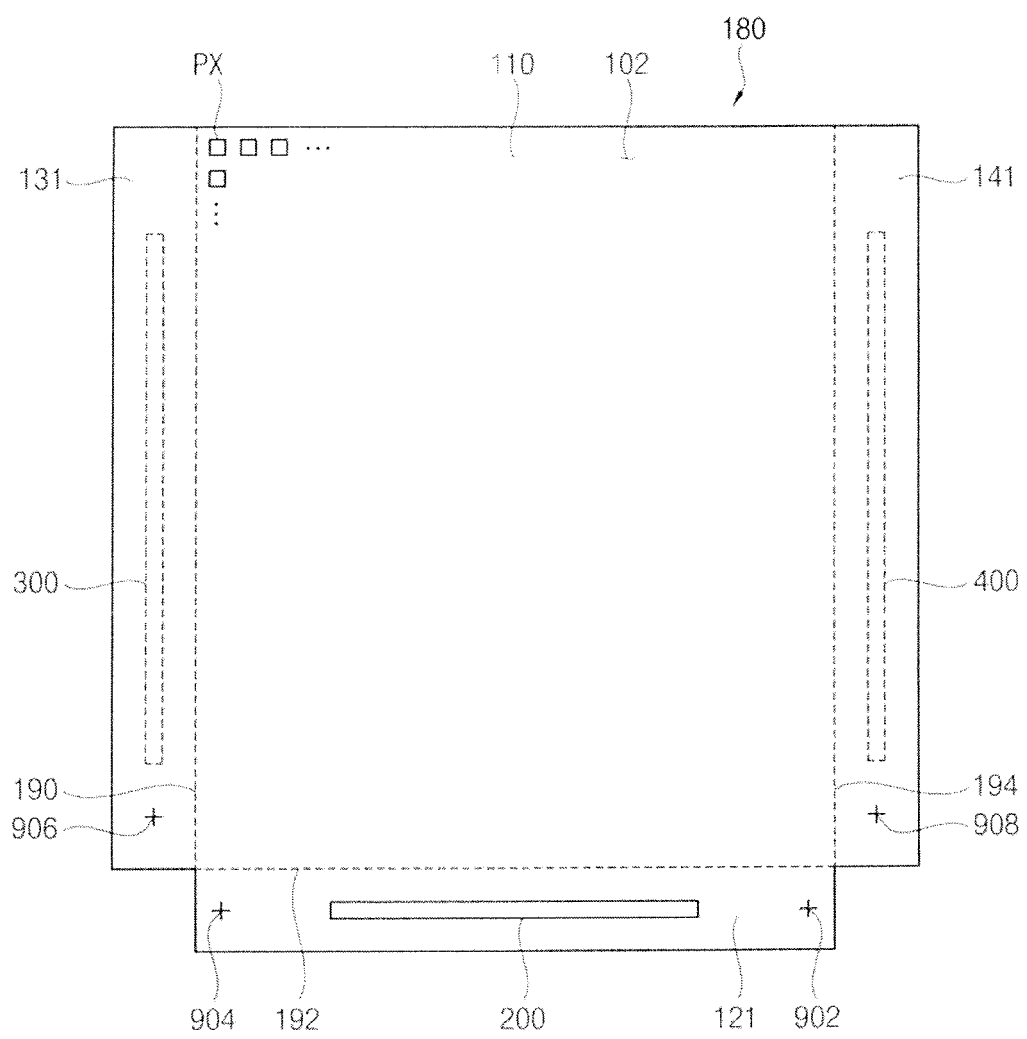
FIG. 11 is a plan view illustrating a method of manufacturing a flexible display apparatus according to an exemplary embodiment of the present invention.
Figure 12:
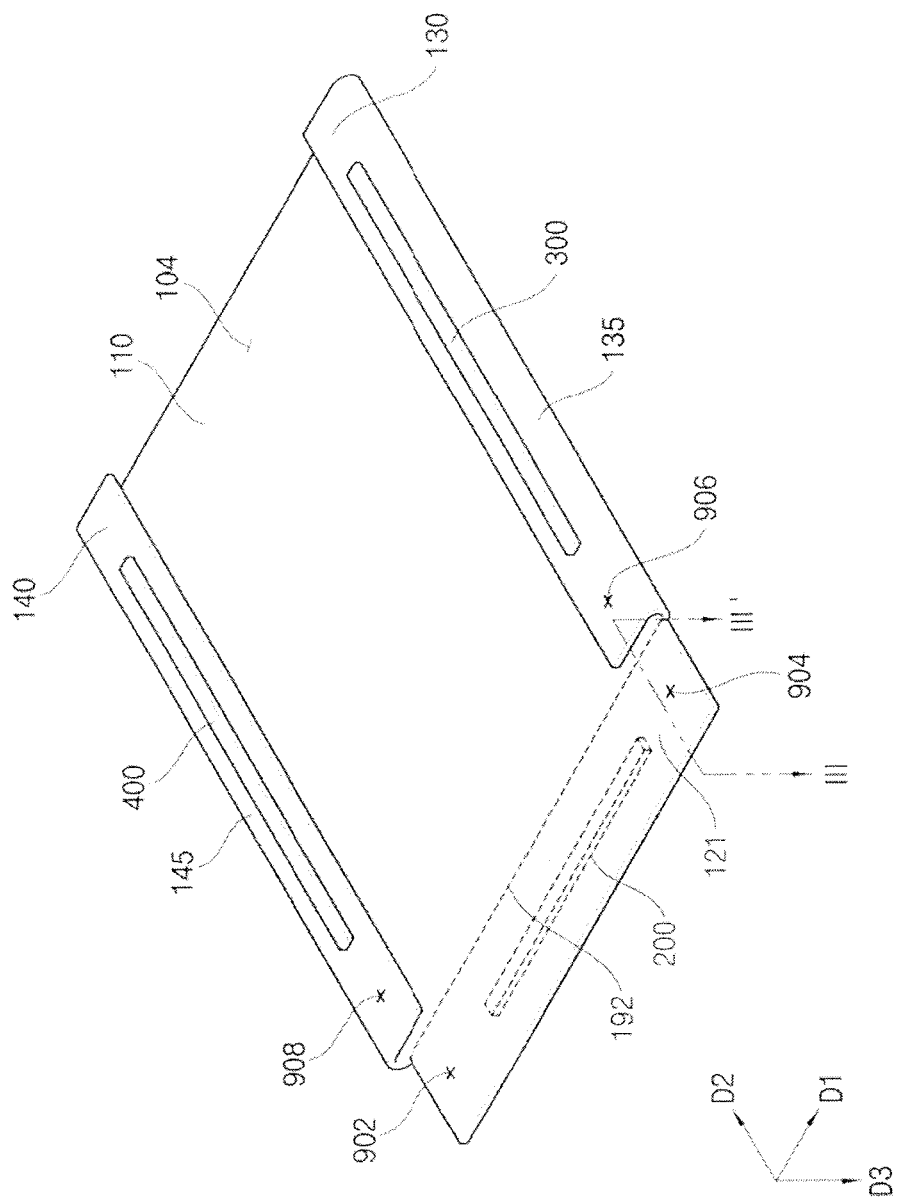
FIG. 12 is a perspective view illustrating a method of manufacturing a flexible display apparatus according to an exemplary embodiment of the present invention.
Figure 13:
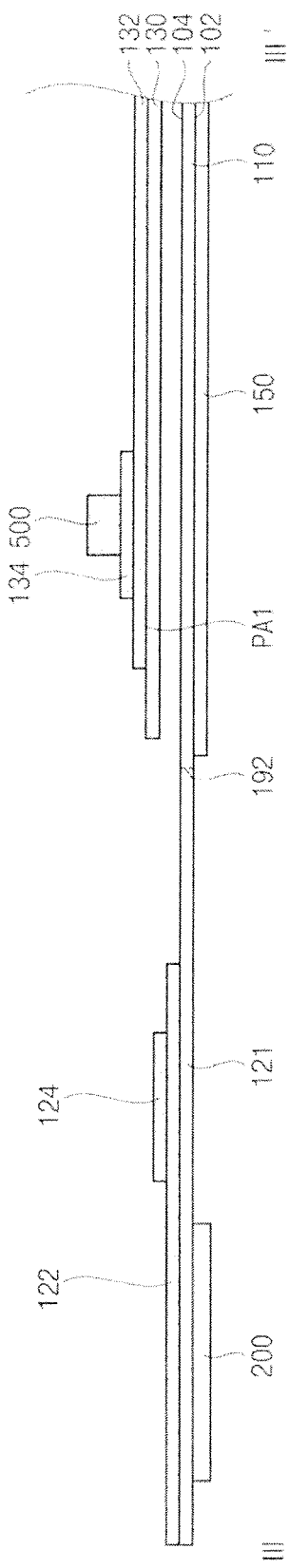
FIG. 13 is a cross-sectional view cut along the line III-III' of FIG. 12, according to an exemplary embodiment of the present invention.

FIG. 11 is a plan view illustrating a method of manufacturing a flexible display apparatus according to an exemplary embodiment of the present invention. FIG. 12 is a perspective view illustrating a method of manufacturing a flexible display apparatus according to an exemplary embodiment of the present invention. FIG. 13 is a cross-sectional view cut along the line III-III' of FIG. 12, according to an exemplary embodiment of the present invention.

Figure 14:
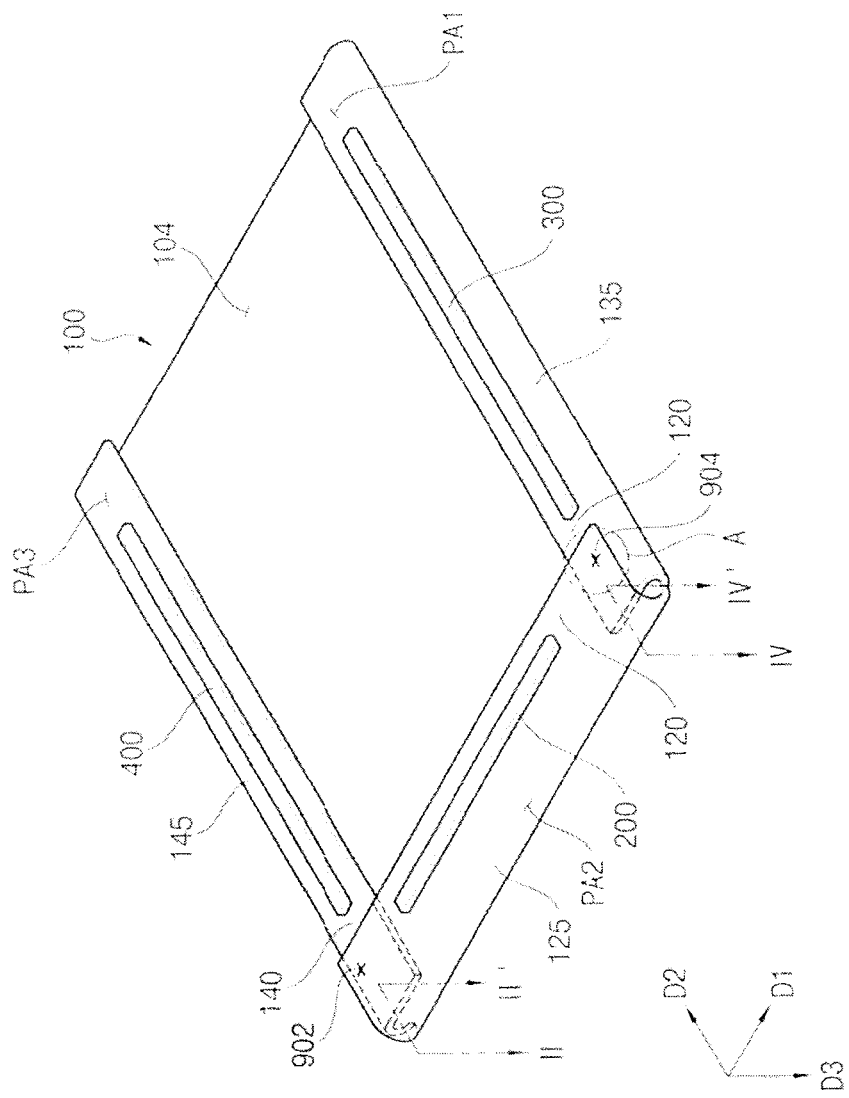
FIG. 14 is a perspective view illustrating a method of manufacturing a flexible display apparatus, according to an exemplary embodiment of the present invention.

FIG. 14 is a perspective view illustrating a method of manufacturing a flexible display apparatus, according to an exemplary embodiment of the present invention. FIG. 15 is an enlarged view of region A of FIG. 14, according to an exemplary embodiment of the present invention. FIG. 16 is a cross-sectional view cut along the line IV-IV' of FIG. 14, according to an exemplary embodiment of the present invention.

Referring to FIG. 11, a preliminary display apparatus is provided. The preliminary display apparatus includes a flexible substrate body 110, a display layer 150, a first preliminary substrate extension portion 131, a second preliminary substrate extension portion 121, a third preliminary substrate extension portion 141, a scan driver 300, a data driver 200 and an emission driver 400.

The flexible substrate body 110 includes a first surface 102 and a second surface 104 opposite to the first surface 102. The display layer 150 is disposed under the first surface 102 of the flexible substrate body 110.

The first preliminary substrate extension portion 131 extends from a first side surface 190 of the flexible substrate body 110. The second preliminary substrate extension portion 121 extends from a second side surface 192 and is connected to the first side surface 190 of the flexible substrate body 110. The third preliminary substrate extension portion 141 extends from a third side surface 194 and is connected to the second side surface 192 and opposite to the first side surface 190 of the flexible substrate body 110.

The scan driver 300 may be mounted on the first preliminary substrate extension portion 131. The data driver 200 may be mounted on the second preliminary substrate extension portion 121. The emission driver 400 may be mounted on the third preliminary substrate extension portion 141.

The first preliminary substrate extension portion 131 may include a first align mark 906 to align the first and second preliminary substrate extension portions 131 and 121. The third preliminary substrate extension portion 141 may include a second align mark 908 to align the third and second preliminary substrate extension portions 141 and 121. The second preliminary substrate extension portion 121 may includes third and fourth align marks 904 and 902 to align with the first and third preliminary substrate extension portions 131 and 141.

Referring to FIG. 12, a first substrate extension portion 130 may be formed by bending the first preliminary substrate extension portion 131 along the first side surface 190 of the flexible substrate body 110 such that the first substrate extension portion 130 overlaps the flexible substrate body 110.

In addition, a third substrate extension portion 140 may be formed by bending the third preliminary substrate extension portion 141 along the third side surface 194 of the flexible substrate body 110 such that the third substrate extension portion 140 overlaps the flexible substrate body 110.

Referring to FIGS. 13, 3 and 4, a first conductive connection member 500 may be arranged on the first substrate extension portion 130. In addition, a second conductive connection member 600 may be arranged on the third substrate extension portion 140.

A first connection wire 132 and a first conductive pad 134 may be formed on the first substrate extension portion 130, and a second connection wire 122 and a second conductive pad 124 may be formed on the second preliminary substrate extension portion 121.

A third connection wire 142 and a third conductive pad 144 may be formed on the third substrate extension portion 140, and a fourth connection wire 126 and a fourth conductive pad 128 may be formed on the second preliminary substrate extension portion 121.

The first conductive connection member 500 may be arranged on the first conductive pad 134, and the second conductive connection member 600 may be arranged on the third conductive pad 144.

For example, each of the first and second conductive connection members 500 and 600 may include an anisotropic conductive film.

Referring to FIGS. 14 and 15, a second substrate extension portion 120 may be formed by bending the second preliminary substrate extension portion 121 along the second side surface 192 of the flexible substrate body 110 such that the second substrate extension portion 120 overlaps the flexible substrate body 110 and the first and second substrate extension portions 130 and 140.

The third align mark 904 may be aligned with the first align mark 906, and the fourth align mark 902 may be aligned with the second align mark 908 such that the second substrate extension portion 120 is formed.

Referring to FIG. 16, heat and pressure may be applied to the first conductive connection member 500 by a thermal compression process such that the data driver 200 and the scan driver 300 are electrically connected to each other.

According to the method of manufacturing the flexible display apparatus, the first substrate extension portion 130 may overlap the second substrate extension portion 120. The scan driver 300 and the data driver 200 may be electrically connected to each other through the first conductive connection member 500.

The third substrate extension portion 140 may overlap the second substrate extension portion 120. The data driver 200 and the emission driver 400 may be electrically connected to each other through the second conductive connection member 600.

Accordingly, a bending stress which is applied to the wires 132, 122, 142 and 126 may be reduced such that an electrical connection reliability of the flexible display apparatus is increased.

Figure 17:
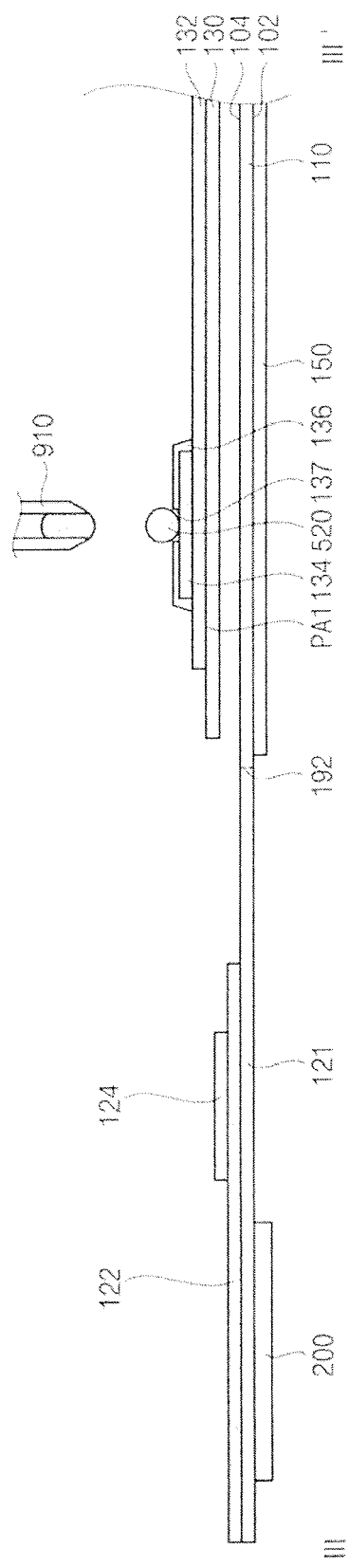
FIG. 17 is a cross-sectional view cut along the line II-III' of FIG. 12 illustrating a method of manufacturing a flexible display apparatus according to an exemplary embodiment of the present invention.

FIG. 17 is a cross-sectional view cut along the line III-III' of FIG. 12 illustrating a method of manufacturing a flexible display apparatus according to an exemplary embodiment of the present invention. FIG. 18 is a cross-sectional view cut along the line IV-IV' of FIG. 14 illustrating a method of manufacturing a flexible display apparatus, according to an exemplary embodiment of the present invention.

Referring to FIG. 11, a preliminary display apparatus is provided. The preliminary display apparatus includes a flexible substrate body 110, a display layer 150, a first preliminary substrate extension portion 131, a second preliminary substrate extension portion 121, a third preliminary substrate extension portion 141, a scan driver 300, a data driver 200 and an emission driver 400.

The flexible substrate body 110 includes a first surface 102 and a second surface opposite 104 to the first surface 102. The display layer 150 is disposed under the first surface 102 of the flexible substrate body 110.

The first preliminary substrate extension portion 131 extends from a first side surface 190 of the flexible substrate body 110. The second preliminary substrate extension portion 121 extends from a second side surface 192 connected to the first side surface 190 of the flexible substrate body 110. The third preliminary substrate extension portion 141 extends from a third side surface 194 connected to the second side surface 192 and opposite to the first side surface 190 of the flexible substrate body 110.

The scan driver 300 may be mounted on the first preliminary substrate extension portion 131. The data driver 200 may be mounted on the second preliminary substrate extension portion 121. The emission driver 400 may be mounted on the third preliminary substrate extension portion 141.

Referring to FIG. 12, a first substrate extension portion 130 may be formed by bending the first preliminary substrate extension portion 131 along the first side surface 190 of the flexible substrate body 110 such that the first substrate extension portion 130 overlaps the flexible substrate body 110.

In addition, a third substrate extension portion 140 may be formed by bending the third preliminary substrate extension portion 141 along the third side surface 194 of the flexible substrate body 110 such that the third substrate extension portion 140 overlaps the flexible substrate body 110.

Referring to FIGS. 17, 7 and 8, a first conductive connection member 520 may be arranged on the first substrate extension portion 130. In addition, a second conductive connection member 620 may be arranged on the third substrate extension portion 140.

A first connection wire 132 and a first conductive pad 134 may be formed on the first substrate extension portion 130, and a second connection wire 122 and a second conductive pad 124 may be formed on the second preliminary substrate extension portion 121.

In an exemplary embodiment of the present invention, an insulation guide layer 136 may be formed to cover a side surface and a portion of a top surface of the first conductive pad 134. The insulation guide layer 136 may be formed to expose a portion of the top surface of the first conductive pad 134.

For example, the insulation guide hole 136 may be formed to include a guide hole 137 in which at least a portion of the first conductive connection member 520 is inserted. The insulation guide layer 136 may include polyimide.

A third connection wire 142 and a third conductive pad 144 may be formed on the third substrate extension portion 140, and a fourth connection wire 126 and a fourth conductive pad 128 may be formed on the second preliminary substrate extension portion 121.

In an exemplary embodiment of the present invention, an insulation guide layer 146 may be formed to cover a side surface and a portion of a top surface of the third conductive pad 144. The insulation guide layer 146 may be formed to expose a portion of the top surface of the third conductive pad 144.

For example, the insulation guide 146 may be formed to include a guide hole 147 in which at least a portion of the second conductive connection member 620 is inserted. The insulation guide layer 146 may include polyimide.

The first conductive connection member 520 may be arranged on the first conductive pad 134, and the second conductive connection member 620 may be arranged on the third conductive pad 144.

For example, each of the first and second conductive connection members 520 and 620 may include a liquid metal or a conductive polymer material.

For example, each of the first and second conductive connection members 520 and 620 may be disposed on a respective one of the first and third substrate extension portions 130 and 140 by using a dispenser 910. Alternatively, each of the first and second conductive connection members 520 and 620 may be disposed on a respective one of the first and third substrate extension portions 130 and 140 by an inkjet printing process.

The first and second conductive connection members 520 and 620 may be inserted in the insulation guide layers 136 and 146, respectively, in a liquid state.

Referring to FIGS. 14 and 15, a second substrate extension portion 120 may be formed by bending the second preliminary substrate extension portion 121 along the second side surface 192 of the flexible substrate body 110 such that the second substrate extension portion 120 overlaps the flexible substrate body 110 and the first and second substrate extension portions 130 and 140.

Referring to FIG. 18, heat may be applied to the first and second conductive connection members 520 and 620 such that the liquid state of the first and second conductive connection members 520 and 620 is transformed into a solid state of the first and second conductive connection members 520 and 620. For example, the heat transforms the liquid first and second conductive connection members 520 and 620 into solid first and second conductive connection members 520 and 620.

Accordingly, the scan driver 300 and the data driver 200 may be electrically connected to each other through the first conductive connection member 520. The data driver 200 and the emission driver 400 may be electrically connected to each other through the second conductive connection member 620.

According to the method of manufacturing the flexible display apparatus, the first substrate extension portion 130 may overlap the second substrate extension portion 120. The scan driver 300 and the data driver 200 may be electrically connected to each other through the first conductive connection member 520.

The third substrate extension portion 140 may overlap the second substrate extension portion 120. The data driver 200 and the emission driver 400 may be electrically connected to each other through the second conductive connection member 620.

Accordingly, a bending stress which is applied to the wires 132, 122, 142 and 126 may be reduced such that an electrical connection reliability of the flexible display apparatus is increased.

While the present invention has been particularly shown and described with reference to exemplary embodiments thereof, it will be apparent to those of ordinary skill in the art that various changes in form and detail may be made therein without departing from the spirit and scope of the present invention.

What is claimed is:

1. A flexible display apparatus comprising:
a flexible substrate body including a first surface, a second surface opposite to the first surface, a first side surface and a second side surface connected to the first side surface;
a display layer disposed on the first surface of the flexible substrate body;
a first substrate extension portion extending from the first side surface of the flexible substrate body and bent along the first side surface of the flexible substrate body, the first substrate extension portion overlapping the flexible substrate body;
a second substrate extension portion extending from the second side surface of the flexible substrate body and bent along the second side surface of the flexible substrate body, the second substrate extension portion overlapping the flexible substrate body and the first substrate extension portion;

first and second drivers providing driving signals to the display layer, wherein the first and second drivers are mounted on the first and second substrate extension portions, respectively;
a first conductive connection member disposed between the first and second substrate extension portions, the first conductive connection member electrically connecting the first substrate extension portion with the second substrate extension portion;
a first connection wire disposed on the first substrate extension portion;
a first conductive pad disposed on the first connection wire and including a first insertion hole exposing the first connection wire, wherein a first side of the first conductive connection member is inserted into the first insertion hole; and
a second conductive pad disposed on the second substrate extension portion and electrically connected to the first conductive connection member.

2. The flexible display apparatus of claim 1, wherein the first conductive connection member includes an anisotropic conductive film (ACF) material.

3. The flexible display apparatus of claim 1, wherein the first conductive connection member has a cylindrical shape or a spherical shape.

4. The flexible display apparatus of claim 1, wherein the first conductive connection member includes a conductive polymer material.

5. The flexible display apparatus of claim 4, wherein the first conductive connection member includes polyacetylene, polyparaphenylene, polypyrole or polyaniline.

6. The flexible display apparatus of claim 1, wherein the first conductive connection member includes a plurality of nano wires or a plurality of nano tubes.

7. The flexible display apparatus of claim 1, wherein
the first conductive pad electrically connects the first conductive connection member with the first driver and makes contact with the first conductive connection member.

8. The flexible display apparatus of claim 7, further comprising:
an insulation guide layer covering a side surface and a first portion of a top surface of the first conductive pad, the insulation guide layer exposing a second portion of the top surface of the first conductive pad,
wherein a portion of the first conductive connection member passes through the insulation guide layer.

9. The flexible display apparatus of claim 7, wherein
the second conductive pad electrically connects the first conductive connection member with the second driver and makes contact with the first conductive connection member,
wherein the second conductive pad includes a second insertion holes in which a second side of the first conductive connection member is inserted.

10. The flexible display apparatus of claim 9, further comprising:
a second connection wire disposed on the second substrate extension portion, the second connection wire electrically connecting the second conductive pad and the second driver, wherein the first connection wire electrically connects the first conductive pad and the first driver,
wherein the first side of the first conductive connection member is inserted in a third insert hole provided at the first connection wire, and the second side of the first conductive connection member is inserted in a fourth insertion hole provided at the second connection wire.

11. The flexible display apparatus of claim 10, wherein the first and third insertion holes are connected to each other, and a cross-sectional size of the third insertion hole is greater than a cross-sectional size of the first insertion hole, and
wherein the second and fourth insertion holes are connected to each other, and a cross-sectional size of the fourth insertion hole is greater than a cross-sectional size of the second insertion hole.

12. The flexible display apparatus of claim 11, wherein the first conductive connection member has a cross-sectional I shape.

13. The flexible display apparatus of claim 1, further comprising:
a third substrate extension portion extending from a third side surface of the flexible substrate body and bent along the third side surface of the flexible substrate body, the third substrate extension portion overlapping the flexible substrate body and the second substrate extension portion, wherein the third side surface of the flexible substrate body is connected to the second side surface of the flexible substrate body and is opposite to the first side surface of the flexible substrate body;
a third driver providing a driving signal to the display layer, wherein the third driver is mounted on the third substrate extension portion; and
a second conductive connection member disposed between the second and third substrate extension portions, the second conductive connection member electrically connecting the second driver with the third driver.

14. The flexible display apparatus of claim 13, wherein the first driver is a scan driver, the second driver is a data driver, and the third driver is an emission driver.

15. The flexible display apparatus of claim 1, further comprising:
a third conductive connection member disposed between the flexible substrate body and the first substrate extension portion, the third conductive connection member electrically connecting the first driver with the display layer.

16. The flexible display apparatus of claim 1, wherein the flexible substrate body, the first substrate extension portion and the second substrate extension portion include polyimide.

17. The flexible display apparatus of claim 1, wherein the display layer includes a liquid crystal layer or an organic light emitting layer.

18. A method of manufacturing a flexible display apparatus, the method comprising:
providing a preliminary display apparatus including a flexible substrate body including a first surface and a second surface opposite to the first surface, a display layer disposed on the first surface of the flexible substrate body, a first preliminary substrate extension portion extending from a first side surface of the flexible substrate body, a second preliminary substrate extension portion extending from a second side surface of the flexible substrate body, and first and second drivers providing driving signals to the display layer, wherein the first driver is mounted on the first preliminary substrate extension portion, the second driver is mounted on the second preliminary substrate extension portion, and wherein the second side surface of the flexible substrate body is connected to the first side surface of the flexible substrate body;

bending the first preliminary substrate extension portion along the first side surface of the flexible substrate body such that a first substrate extension portion is formed to overlap the flexible substrate body;

disposing a conductive connection member on the first substrate extension portion, the conductive connection member electrically connecting the first preliminary substrate extension portion and the second preliminary substrate extension portion;

bending the second preliminary substrate extension portion along the second side surface of the flexible substrate body such that a second substrate extension portion is formed to overlap the flexible substrate body and the first substrate extension portion; and electrically connecting the first driver with the second driver through the conductive connection member; wherein a first connection wire is disposed on the first preliminary substrate extension portion;

a first conductive pad is disposed on the first connection wire and including a first insertion hole exposing the first connection wire, wherein a first side of the first conductive connection member is inserted into the first insertion hole; and a second conduction pad is disposed on the second preliminary substrate extension portion and electrically connected to the first conductive connection member.

19. The method of claim 18, wherein the conductive connection member includes an anisotropic conductive film (ACF) material, and wherein electrically connecting the first driver with the second driver includes:

performing a thermal compression process to electrically connect the first driver with the second driver through the conductive connection member.

20. The method of claim 18, wherein the conductive connection member includes a liquid metal or a conductive polymer material, and wherein the conductive connection member is disposed on the first substrate extension portion by a dispenser or an inkjet printing process.

21. The flexible display apparatus of claim 1, further comprising:

a second connection wire disposed between the second substrate extension portion and the second conductive pad, wherein the second conductive pad includes a second insertion hole that exposes the second connection wire, a second side of the first conductive connection member is inserted into the second insertion hole, and the first conductive member is directly connected to the first connection wire and the second connection wire.

* * * * *